United States Patent
Whitney et al.

(10) Patent No.: US 12,302,530 B2
(45) Date of Patent: May 13, 2025

(54) METHOD AND APPARATUS FOR IMMERSION BOILER SUPPORT

(71) Applicant: Aavid Thermalloy, LLC, Laconia, NH (US)

(72) Inventors: Bradley R. Whitney, Epsom, NH (US); Michael Beliveau, Belmont, NH (US); Frederic Elie Philippon, Kirkland, WA (US)

(73) Assignee: Aavid Thermalloy, LLC, Laconia, NH (US)

( * ) Notice: Subject to any disclaimer, the term of this patent is extended or adjusted under 35 U.S.C. 154(b) by 213 days.

(21) Appl. No.: 17/832,037

(22) Filed: Jun. 3, 2022

(65) Prior Publication Data

US 2023/0397368 A1   Dec. 7, 2023

(51) Int. Cl.
*H05K 7/20* (2006.01)
*F28F 13/18* (2006.01)

(52) U.S. Cl.
CPC ........... *H05K 7/203* (2013.01); *F28F 13/182* (2013.01); *H05K 7/20327* (2013.01); *F28F 2245/00* (2013.01); *F28F 2255/18* (2013.01)

(58) Field of Classification Search
CPC ............... H05K 7/203; H05K 7/20309; H05K 7/20327; F28F 13/182; F28F 2245/00; F28F 2255/18; H01L 23/10; H01L 23/44; H01L 23/427; H01L 23/3733; F28D 2021/0028

See application file for complete search history.

(56) References Cited

U.S. PATENT DOCUMENTS

| | | |
|---|---|---|
| 5,556,187 A | 9/1996 | Furuya et al. |
| 8,616,267 B2 | 12/2013 | Capriz et al. |
| 2015/0216089 A1 | 7/2015 | Tanaka et al. |
| 2016/0123637 A1 | 5/2016 | Moreno et al. |
| 2018/0027696 A1 | 1/2018 | Franz et al. |
| 2021/0410329 A1 | 12/2021 | Yang et al. |
| 2023/0048500 A1* | 2/2023 | Malouin ............ H05K 7/20263 |
| 2023/0164953 A1* | 5/2023 | Gregory ............. H05K 7/20818 165/104.26 |
| 2023/0254997 A1* | 8/2023 | Shaw ..................... H05K 7/203 361/679.47 |

* cited by examiner

*Primary Examiner* — Henry T Crenshaw
*Assistant Examiner* — Kamran Tavakoldavani
(74) *Attorney, Agent, or Firm* — Wolf, Greenfield & Sacks, P.C.

(57) ABSTRACT

A heat transfer arrangement for use with an immersion cooling system. A support is configured to contact a heat transfer device such as a vapor chamber or spreader plate to stiffen the heat transfer device and urge the heat transfer device into contact with a heat generating device. The support includes an arm that has a first portion that extends toward a central area of the heat transfer device over and out of contact with the heat transfer device and a second portion that contacts the heat transfer device within the central area. The arm can avoid contact with the heat transfer device, including surfaces having a boiling enhancement coating configured to transfer heat to a cooling liquid.

24 Claims, 4 Drawing Sheets

METHOD AND APPARATUS FOR IMMERSION BOILER SUPPORT

FIELD OF INVENTION

A heat transfer device for use in immersion cooling systems, e.g., for cooling electronics using a bath of cooling fluid.

BACKGROUND

With the development of electronic technology, heat dissipation requirements for computer processing devices, e.g., integrated circuits or chips, has increased, requiring ever higher efficiency heat exchange devices to remove the heat generated by these devices. One technique for cooling electronic devices is to immerse the devices and/or a heat sink thermally connected to the devices in a dielectric cooling liquid. Heat is dissipated from the devices by boiling or otherwise heating the cooling liquid in contact with the devices and/or heat sink. The vapor and/or heated liquid is subsequently cooled to return to a denser liquid form and the cooling cycle continues.

SUMMARY OF INVENTION

In some embodiments, an immersion cooling system includes a tank configured to hold a cooling liquid, a heat generating device (such as an integrated circuit or other electronic device) arranged in the tank and configured to generate heat, and a heat transfer device thermally coupled to the heat generating device. In some cases, the heat generating device includes an electronic circuit that is in contact with cooling liquid along with the heat transfer device (in some cases referred to as a boiling plate for two-phase immersion cooling). The heat transfer device, which can be employed in an immersion cooling system or in other applications, can include a base coupled to the heat generating device so as to receive heat from the heat generating device, and transfer heat to the cooling liquid. The heat transfer device can, for example, be a heat spreader plate and/or vapor chamber having a first portion thermally coupled to receive heat from the heat generating device and a second portion configured to transfer heat to the cooling liquid.

In some embodiments, an immersion cooling system includes a heat transfer device having a first side with a first portion configured to contact and receive heat from a heat generating device and a second side with a second portion including a boiling enhancement coating configured to transfer heat received at the first portion to a cooling liquid. The boiling enhancement coating can be formed by a sintered powder material and/or mesh that forms a porous structure, i.e., a porous or other surface effective in enhancing boiling can be formed by any suitable additive and/or subtractive manufacturing means. In some cases, the second portion bearing the boiling enhancement coating can be 40 to 90% of a total area of the second side of the heat transfer device, although other fractions up to 100% can be employed. The second portion of the heat transfer device can be different in size than the first portion, e.g., the second portion can have an area that is 150% to 5000% larger than the first portion of the heat transfer device, or can have a same or smaller size. The heat transfer device can include a peripheral area around a central area, e.g., the peripheral area can extend a distance inwardly from an edge of the heat transfer device and surround the central area. For example, the heat transfer device can be a spreader plate having the first and second sides, or a vapor chamber having a first plate that defines the first side and a second plate joined to the first plate that defines the second side. The vapor chamber can have a working fluid chamber between the first and second plates in which working fluid is contained, e.g., the vapor chamber can operate as a two-phase cooling device. In some cases, the first and second portions of the heat transfer device are on opposite sides of the heat transfer device, e.g., on top and bottom surfaces of the heat transfer device. In some embodiments, the heat transfer device can include at least one plate to define the first or second portion, and the first or second side can be planar. For example, the heat transfer device can be planar on both sides, planar on only one side, or non-planar on both sides.

In some embodiments, a support can be configured to contact the second side of the heat transfer device within the central area to stiffen the heat transfer device and urge the first portion into contact with the heat generating device. For example, in some cases the heat transfer device may have insufficient strength to maintain suitable contact between the first portion of the heat transfer device and the heat generating device for heat transfer when engaged solely at the peripheral area. The support can provide suitable stiffness or other strength to the heat transfer device to suitably contact the heat generating device, e.g., even in cases where the heat transfer device is made to be relatively flexible.

In some embodiments, the support includes an arm that has a first portion that extends toward the central area over and out of contact with the heat transfer device and a second portion that contacts the heat transfer device within the central area. This arrangement can allow the support to apply suitable force to the heat transfer device in a central area, e.g., to help provide suitable contact force between the heat transfer device and the heat generating device, while leaving portions of the heat transfer device available for contact with cooling liquid. In some cases, the support can be configured to avoid contact with a majority of the second portion in the central area. In some cases, the first portion of the arm extends inwardly over (and optionally out of contact with) the peripheral area toward the central area. In some embodiments, the support includes a plurality of arms and second portions of the plurality of arms define a window with at least one opening that extends around and exposes a part of the central area. The lower surface of the window can contact the heat transfer device at the central area to urge the first portion of the heat transfer device into contact with the heat generating device. In some embodiments, the support includes a frame positioned over the peripheral area and a plurality of arms that each extend radially inwardly from the frame and over a portion of the central area. In some cases, the plurality of arms can form an X shape over the central area. The second portion of each of the arms can include a post that extends downwardly to contact the second side.

The support can be configured to engage the heat transfer device in various ways. In some cases, each of a plurality of arms can be configured to engage with a fastener to secure the heat transfer device to the heat generating device. For example, fasteners may be configured to engage the support and secure the support and heat transfer device to the heat generating device with the fasteners each extending through a corresponding opening at the peripheral area of the heat transfer device.

A heat transfer device and support can be employed in an immersion cooling system, e.g., a system that includes a tank configured to hold the cooling liquid, a heat generating device arranged in the tank and configured to generate heat, and a heat transfer device held in contact with the heat generating device by the support.

These and other aspects of the invention will be appreciated from the following description and claims.

BRIEF DESCRIPTION OF THE DRAWINGS

Aspects of the invention are described with reference to the following drawings in which numerals reference like elements, and wherein.

DETAILED DESCRIPTION

Aspects of the invention are not limited in application to the details of construction and the arrangement of components set forth in the following description or illustrated in the drawings. Other embodiments may be employed and aspects of the invention may be practiced or be carried out in various ways. Also, aspects and/or different features of embodiments may be used alone or in any suitable combination with each other. Thus, the phraseology and terminology used herein is for the purpose of description and should not be regarded as limiting.

Heat transfer devices, such as vapor chambers, spreader plates and heat sinks, are vitally important to cool critical electronics components such as CPU's, GPU's, FPGA's and other ASIC's in advanced electronics equipment. Electronics components generally have a relatively small surface area for heat transfer, and so heat transfer devices are employed to increase the area for heat transfer. The heat transfer devices are attached to the electronics components and enable heat from the components to be transferred to fluids that come into contact with the heat transfer devices. Flow of the cooling fluid may be achieved by natural motion resulting from the action of gravity on density differences within the fluid or by forced means such as fans and pumps. As power levels and heat densities of electronics components and systems have increased, more and more sophisticated heat transfer devices have been developed to remove the heat and prevent excessive component temperatures. Two-phase immersion cooling is a more recent technology where the electronics system is immersed completely within a pool of dielectric cooling liquid that is maintained near its boiling point and allowed to vaporize when heated. Heat transfer devices for immersion cooling provide a base plate that attaches to the component to receive heat from a heat generating device (such as an integrated circuit) and an enhanced boiling surface coating to transfer the heat by efficient boiling of the cooling fluid. Sintering copper or other metal powder into a copper or other metal plate is a cost effective way to make a high performance boiling enhancement coating for two-phase immersion cooling. This type of surface coating has shown the highest boiling performance for many dielectric fluids that are suitable for two-phase immersion cooling of electronics. Other types of boiling enhancement coatings can be used as well, such as mesh, skived fin structures, etc. Fluid vaporized at the enhanced boiling surface coating rises to the surface of the liquid pool, condenses on a cold heat exchange surface, and drips back into the pool as a liquid.

Heat transfer devices, such as spreader plates and vapor chambers, are often made as thin as possible or otherwise to include a minimum amount of conductive material while maximizing the surface area of the heat transfer device. This enables the heat transfer device to transfer heat more effectively to a surrounding cooling fluid while reducing the heat capacitance of the heat transfer device. However, there is a limit to how thin or otherwise reduced in mass a heat transfer device can be made while maintaining the device's ability to suitably maintain structural integrity, e.g., to maintain proper thermal contact with a heat generating device. For example, if a heat spreader plate or vapor chamber is made of extremely thin sheets of material, the plate or chamber may not be able to maintain a shape to properly contact a heat generating device. Moreover, in some cases, a heat transfer device may be required to apply a particular minimum load onto a heat generating device, e.g., to help ensure the heat generating device makes proper electrical contact with another component. This can require the heat transfer device to be made more robustly to meet the additional force application requirements, which can be counter to any motivation to make the heat transfer device thinner and/or lower in mass to improve heat transfer characteristics.

In some embodiments, a heat transfer device support is provided for a heat transfer device, e.g., suitable for in immersion cooling systems. Since the support can provide needed mechanical support (e.g., stiffness, rigidity, flexibility, resilience, etc.) for a heat transfer device, the heat transfer device can be made relatively thin or otherwise have a reduced mass. For example, a heat spreader plate can be made very thin (e.g., less than 5 or 6 mm such as 0.5 mm to 2.5 mm) and in a way that the heat spreader plate could not properly function on its own. For example, the thin heat spreader plate may have insufficient strength and/or stiffness to suitably contact a heat generating device for heat transfer and/or electrical contact if engaged only at a periphery of spreader plate, e.g., by clamps or fasteners. A heat transfer device support can provide mechanical support for the thin heat spreader plate to ensure the heat spreader plate properly contacts the heat generating device to receive heat and otherwise maintains proper shape and mechanical integrity to perform its functions. In addition, the support can provide suitable contact force with the heat generating device to ensure suitable electrical contact between the heat generating device an another structure, such as a printed circuit board on which the heat generating device is mounted.

Figure 1:
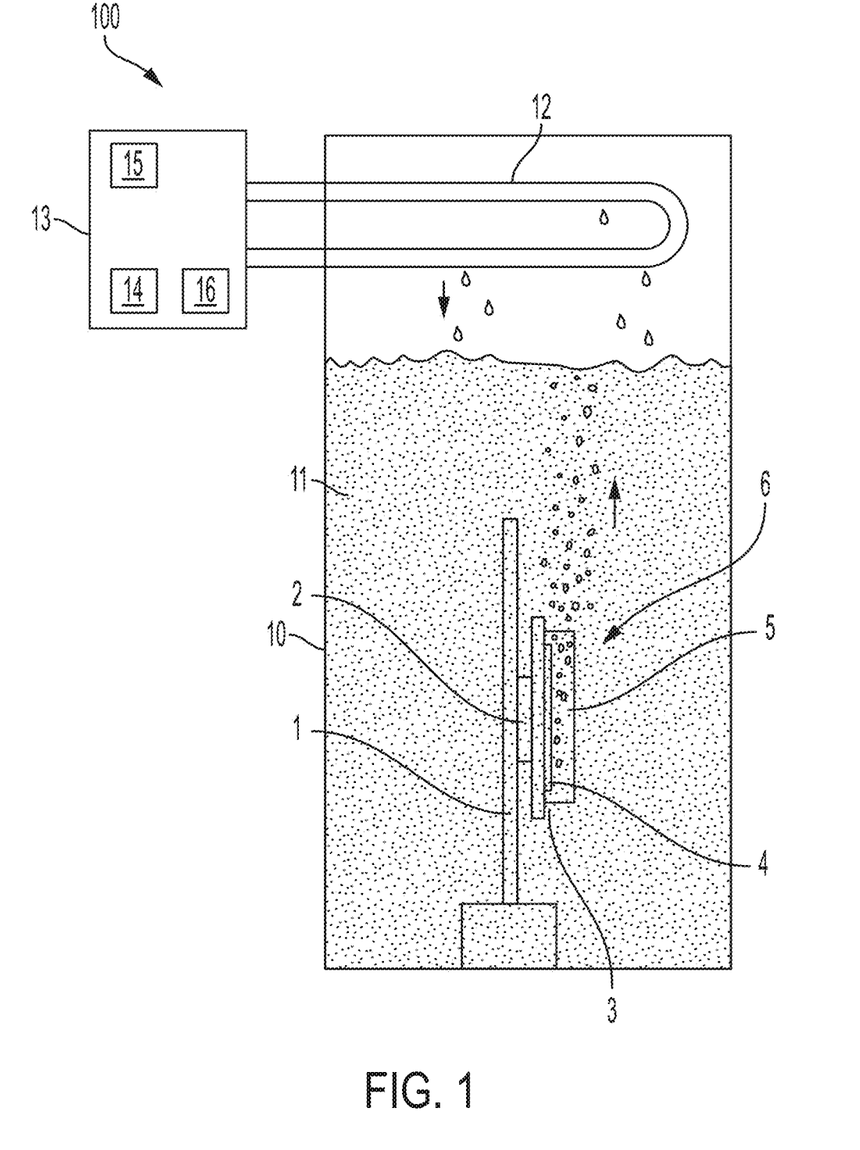
FIG. 1 is a schematic view of an immersion cooling system in an illustrative embodiment.

FIG. 1 shows a two-phase liquid immersion cooling system 100 in an illustrative embodiment. While embodiments of a heat transfer device and support are described in connection with a two-phase immersion cooling system, use with such systems is not required, e.g., a heat transfer device and support including features described herein can be used with a single phase immersion cooling system or other arrangements. In FIG. 1, the system 100 includes a tank configured to hold a cooling liquid 11, such as a dielectric liquid that has a suitable boiling temperature and pressure to allow for effective cooling of heat generating devices 2, such as integrated circuits and other electronic devices, that are immersed in the cooling liquid 11. Heat generating devices 2 can be supported on a printed circuit board or other structure 1 that can include other electronic components such as metal traces or wiring used to provide electrical communications between the heat generating devices 2 and other components, e.g., for electrical power, data communications, sensing, control signals, etc. While in this embodiment the heat generating devices 2 and/or other electrical components on a printed circuit board or other structure 1 are immersed in and in contact with the cooling liquid, other arrangements are possible. In some embodiments, heat generating devices 2 and other electrical components can be isolated or otherwise protected from direct contact with the cooling liquid, e.g., components can be housed in a liquid-tight enclosure in the cooling liquid 11. In some embodiments, heat in the tank 10 can be removed by a heat exchanger 12 and associated heat transfer system 13. The heat transfer system 13 can be arranged in any suitable way, e.g., having a pump 14 to circulate a heat transfer fluid between the in-tank heat exchanger 12 and an outside heat exchanger 15 to transfer heat from the tank 10 to a surrounding environment (e.g., the air, water and/or earth outside of the tank 10), and a controller 16 to control operations of the pump 14 and other components of the heat transfer system 13. The heat transfer system 13 can function to cool vapor in the tank 10 so the vapor is condensed to liquid and falls back into the cooling liquid 11 volume.

A heat transfer assembly 6 includes a heat transfer device 3 thermally coupled to the heat generating device 2 to receive heat from the heat generating device 2 and transfer the heat to the cooling liquid 11. Thermal coupling of the heat transfer device 3 to the heat generating device 2 can be done in any suitable way, such as by physically contacting a surface of the heat transfer device 3 with the heat generating device 2, providing a thermal grease or other component between the heat transfer device 3 and the heat generating device 2 to transfer heat between the two, and others. In some embodiments, the heat transfer device 3 includes a spreader plate, e.g., a thermally conductive metal plate that has a first side attached to or otherwise in physical contact with the heat generating device 2 so that heat can be transferred by conduction from the heat generating device 2 to the heat transfer device 3. In some embodiments the heat transfer device 3 includes a vapor chamber, e.g., a first plate that is thermally coupled on a first side to the heat generating device 2 and has a second plate joined to the opposite side of the first plate. A working fluid chamber can be defined in a space between the first and second plates in which working fluid is contained. The working fluid can include liquid and vapor phase components; the liquid phase component can be boiled or otherwise vaporized by heat received from the heat generating device 2 and the vapor phase component can be condensed by heat transfer to the cooling liquid 11. Thus, the heat transfer device 3 can have a first side that is thermally coupled to the heat generating device 2 to receive heat and a second side opposite the first side that transfers heat to the cooling liquid 11.

The heat transfer device 3 can have a boiling enhancement coating 4 on at least part of its outer surface that contacts the cooling liquid 11 to help transfer heat to the cooling liquid 11. As examples, the boiling enhancement coating 4 can include a sintered powder material, a mesh material (such as a metal screen or mesh layer), or any other suitable arrangement that forms a porous structure or other surface configuration to enhance heat transfer to the cooling liquid 11, whether made by additive and/or subtractive manufacturing means. The boiling enhancement coating 4 can be present on a second side of the heat transfer device 3 opposite the heat generating device 2, and the boiling enhancement coating 4 can be on all or part of the opposite second side, e.g., 40% to 90% of a total area of the second side of the heat transfer device 3. In some cases, the heat transfer device 3 can have a peripheral area (e.g., a portion that extends around an outer edge of the heat transfer device 3) and a central area (a portion within the peripheral area). The boiling enhancement coating 4 can be present on the peripheral and/or central area in any suitable pattern or other arrangement, and can be present on parts of the first and/or second sides. The peripheral area can be a part of the heat transfer device 3 that extends around an outer periphery of the heat transfer device 3, and the central area can be remaining portions of the heat transfer device 3 within the peripheral area. In some cases, the peripheral area can extend inwardly from an outer edge of the heat transfer device 3 by a particular percentage of a maximum dimension of the heat transfer device 3, e.g., 5-25% of a maximum width or length of the heat transfer device 3.

In some embodiments, the heat transfer assembly 6 includes a support 5 configured to contact the heat transfer device 3, e.g., at the second side within the central area, to stiffen the heat transfer device and urge a portion of the first side of the heat transfer device 3 into contact with the heat generating device 2. In some cases, the heat transfer device 3 has insufficient strength to maintain suitable contact with the heat generating device for heat transfer when engaged solely at the peripheral area. For example, if only the peripheral area of the heat transfer device 3 is engaged by a clamp or other fastener to hold the heat transfer device 3 in contact with the heat generating device 2, the heat transfer device 3 may not have sufficient strength and/or stiffness to ensure a suitable contact force with the heat generating device 2. This may happen in cases where the heat transfer device 3 is a relatively thin metal plate or plates, as an example. Alternately, or in addition, the heat transfer device 3 may not have suitable strength and/or stiffness to ensure that a heat generating device 2 suitably engages an underlying circuit board or other structure 1 when the heat transfer device 3 is engaged only at its peripheral area. A support 5 can provide stiffness to the heat transfer device 3 and/or otherwise provide suitable contact force between the heat transfer device 3 and a heat generating device 2, as well as between a heat generating device 2 and an underlying structure 1. In some cases, the support 5 can include one or more arms that extend over part of the heat transfer device 3 and contact the heat transfer device 3 in a central area to help press the heat transfer device 3 into suitable contact with a heat generating device 2. In some embodiments, the arm(s) can avoid contact with portions of the heat transfer device 3 on its second side to help provide a larger area for heat transfer to the cooling liquid 11. For example, the arm(s) can have a first portion that extends over and out of contact with the heat transfer device 3 toward the central area, and a second portion can contacts the heat transfer device 3 in the central area, e.g., in a relatively small part of the central area. By having the first portion of the arm(s) extend over and out of contact with the heat transfer device 3, parts of the peripheral area and/or central area, including those that include a boiling enhancement coating 4, can be exposed to the cooling liquid 11 rather than covered by a part of the arm(s), preventing contact between the coating 4 and the cooling liquid 11. This can help improve heat transfer between the heat transfer device 3 and the cooling liquid 11 while also providing mechanical support to the heat transfer device 3, such as by increasing its stiffness.

Figure 2:
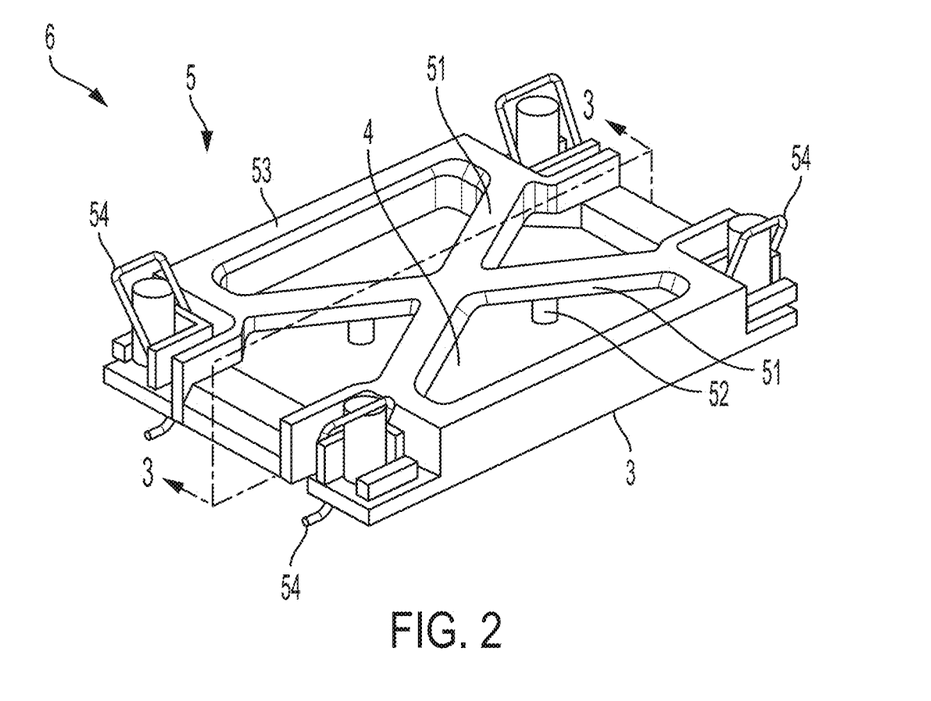
FIG. 2 shows a perspective view of a heat transfer assembly including a heat transfer device and support in an illustrative embodiment.

FIG. 2 shows a perspective view of a heat transfer assembly 6 including a heat transfer device 3 in the form of a vapor chamber and a support 5 that includes one or more arms 51 that each have a first portion that extends over and out of contact with the heat transfer device 3 and a second portion that contacts the heat transfer device 3 at a central area. In some embodiments, the support 5 includes a frame 53 that extends around, and over, a peripheral area of the heat transfer device 3. In some cases, the frame 53 can contact and press downwardly onto the peripheral area of the heat transfer device 3; in some cases the frame 53 may avoid contact with the heat transfer device 3 entirely or contact the heat transfer device 3 in selected locations. The frame 53 can define a closed loop, e.g., a rectangular or other shape element with a central opening. In some embodiments the frame 53 can form a discontinuous structure around the peripheral area of the heat transfer device 3, e.g., the frame 53 can be formed by two or more parts that do or do not contact each other and define a central opening where the heat transfer device 3 is exposed. The arms 51 can extend from the frame 53 inwardly, e.g., radially inwardly, toward the central area of the heat transfer device 3. In some cases, each arm 51 can join with one or more other arms, e.g., to define an X-shape over the heat transfer device 3 as can be seen in FIG. 2. In some embodiments an arm 51 need not join with any other arm 51 and instead may have a first portion that forms a cantilever that extends from the frame 53. A second portion at a more distal end of the arm 51 may contact the central area of the heat transfer device 3.

In some embodiments, a first portion of an arm 51 can extend over and out of contact with the heat transfer device 3, e.g., out of contact with a part of the peripheral area and/or the central area of the heat transfer device 3. This can help maintain the surface of the heat transfer device 3 open for contact with the cooling liquid 11 and transfer of heat which could not occur directly between the heat transfer device 3 and cooling liquid 11 if the arm 51 was in contact with the heat transfer device 3. In some cases, an arm 51 can have a second portion that contacts the heat transfer device 3 within the central area to urge the heat transfer device 3 into contact with the heat generating device 2. For example, the arms 51 can each include a post 52 or other structure that extends downwardly to contact the heat transfer device 3, e.g., on a second side opposite the first side of the heat transfer device 3 which contacts the heat generating device 2. To urge the support 5 into contact with the heat transfer device 3, the support 5 can include one or more fasteners 54, such as clips, springs, bolts, screws, adhesive, etc., that secures the support 5 to the heat generating device 2 and/or to a printed circuit board 1 or other structure on which the heat generating device 2 is mounted. The posts or other contacting structure 52 can engage with the heat transfer device 3 at a relatively small area, which can help maintain a relatively large surface of the heat transfer device 3 available for heat transfer. For example, the support 5 can contact the central area of the heat transfer device 3 in a total area that is 20% or less (e.g., 15%, 10% or 5% or less) of a total area of the second side of the heat transfer device 3 or of a total area that includes a boiling enhancement coating 4. The second side of the heat transfer device 3 can have a boiling enhancement surface 4 where the post 52 contacts the heat transfer device 3, or the boiling enhancement surface 4 can be omitted in the contact area between the support 5 and the heat transfer device 3.

Figure 3:
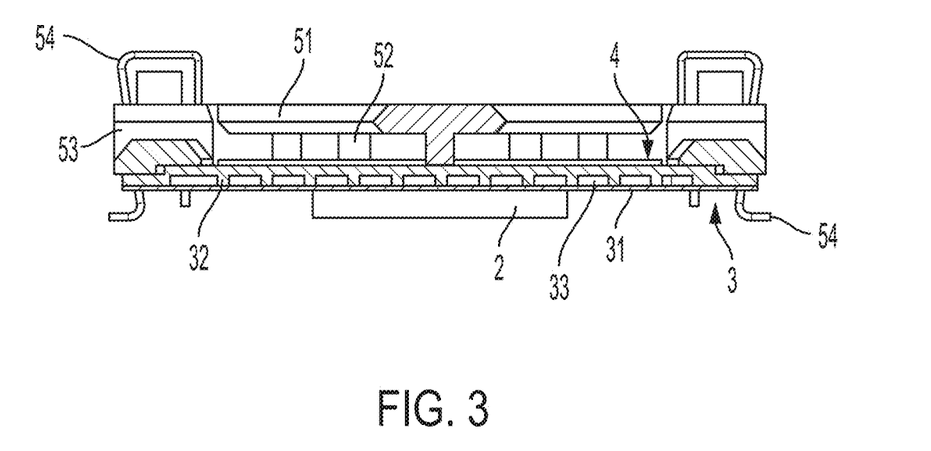
FIG. 3 is a cross sectional view along the line 3-3 in FIG. 2.
Figure 4:
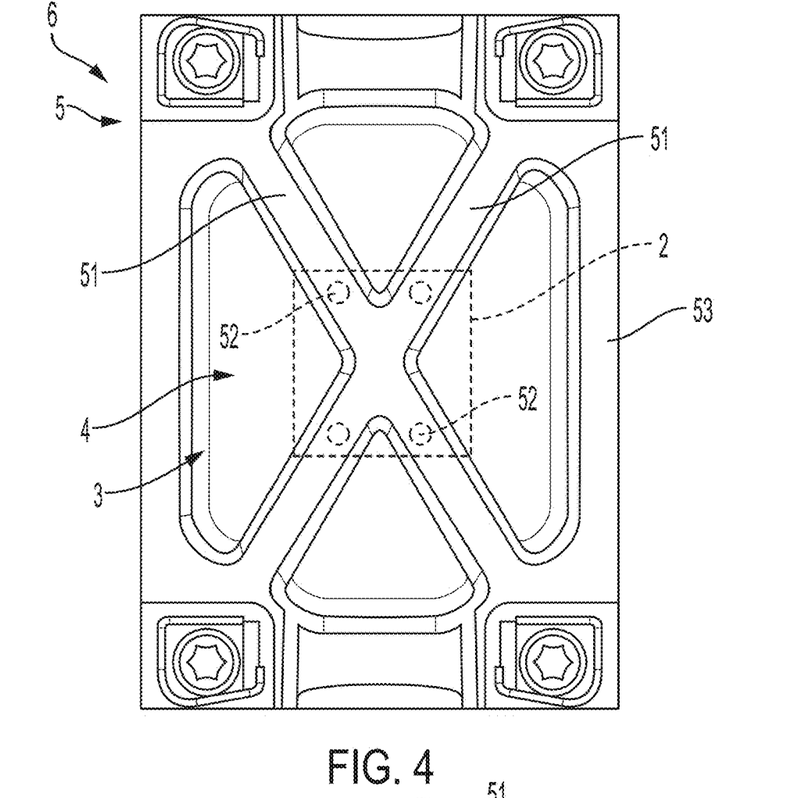
FIG. 4 is a top view of the FIG. 2 heat transfer assembly.

As can be seen in the cross sectional view of FIG. 3, the force exerted by the posts 52 on the heat transfer device 3 can be transmitted through the heat transfer device 3 to the heat generating device 2. Where the heat transfer device 3 includes a vapor chamber with first and second plates 31, 32 defining a working fluid space 33 between them, structure between the plates 31, 32 such as ribs, fins, posts, a mesh, a plate with openings, etc. can be employed to aid in maintaining a minimum volume for the working fluid space 33 as well as transmitting the force of the posts 52 to the heat generating device 2. In some embodiments, the posts or other contacting structure 52 of the arms 51 can be configured to contact the heat transfer device 3 within an area where the heat generating device 2 is located under the heat transfer device 3. For example, FIG. 4 shows a top view and that the posts 52 are located within a contact area between the heat transfer device 3 and the heat generating device 2 (the contact area is indicated in dashed line and with reference number 2 in FIG. 4). This can help reduce deformation of the heat transfer device 3 as well as help maintain proper contacting force between the heat transfer device 3 and the heat generating device 2. In some cases, the posts or other contacting structure 52 can be located in specific locations to provide force in particular areas, e.g., such as over a specific electrical contact area between the heat generating device 2 and an underlying circuit board 1. Thus, in some cases the force of the posts or other contacting structure 52 can aid in establishing and/or maintaining an electrical connection between the heat generating device 2 and an underlying printed circuit board 1 or other structure. The support 5 can be configured to enhance a contacting force between the heat transfer device 3 and the heat generating device 2 in a variety of different ways. For example, the heat transfer device 3 may be designed and manufactured to have a planar bottom and/or contact area with the heat generating device 2. However, the support 5 may be configured such that when the heat transfer device 3 is fully engaged with the support 5, the bottom and/or contact area of the heat transfer device 3 may be forced to adopt a convex shape or downwardly bowed profile. This convexity or downwardly bowed shape may cause the heat transfer device 3 to engage with the heat generating device 2 with an enhanced contact force, e.g., because once the support 5 and heat transfer device 3 are fully engaged with the heat generating device 2, the bottom and/or contact area of the heat transfer device 3 will take a planar shape when fully engaged with the heat generating device 2. This arrangement may also permit the support 5 to provide a resilient biasing force on the heat transfer device 3, e.g., because the one or more arms 51 may flex elastically as the contact area of the heat transfer device 3 flattens with engagement with the heat generating device 2. The resilient force provided by the support 5 on the heat transfer device 3 may help maintain suitable contact between the heat transfer device 3 and the heat generating device 2, even in the presence of thermal expansion and contraction of the components.

Figure 5:
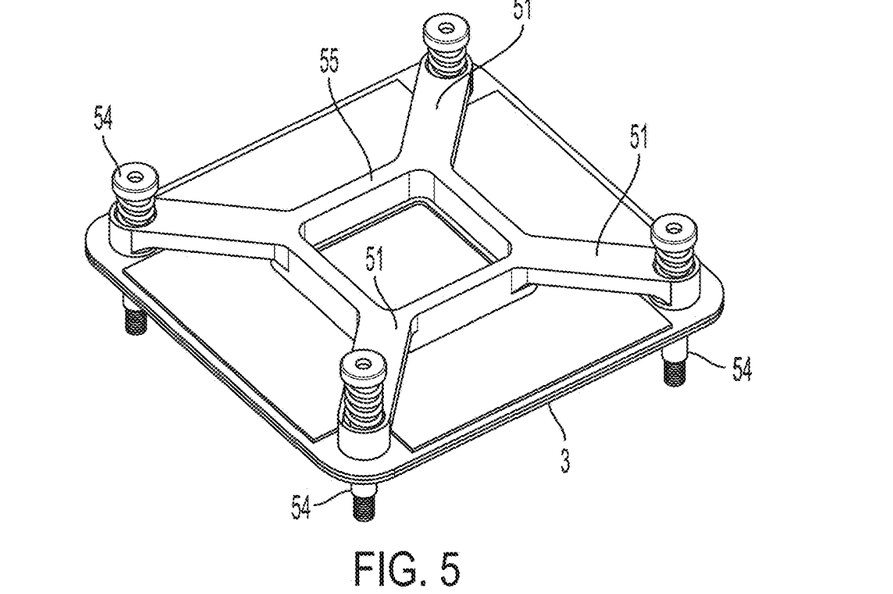
FIG. 5 shows a perspective view of a heat transfer assembly in which the support lacks an outer frame.
Figure 6:
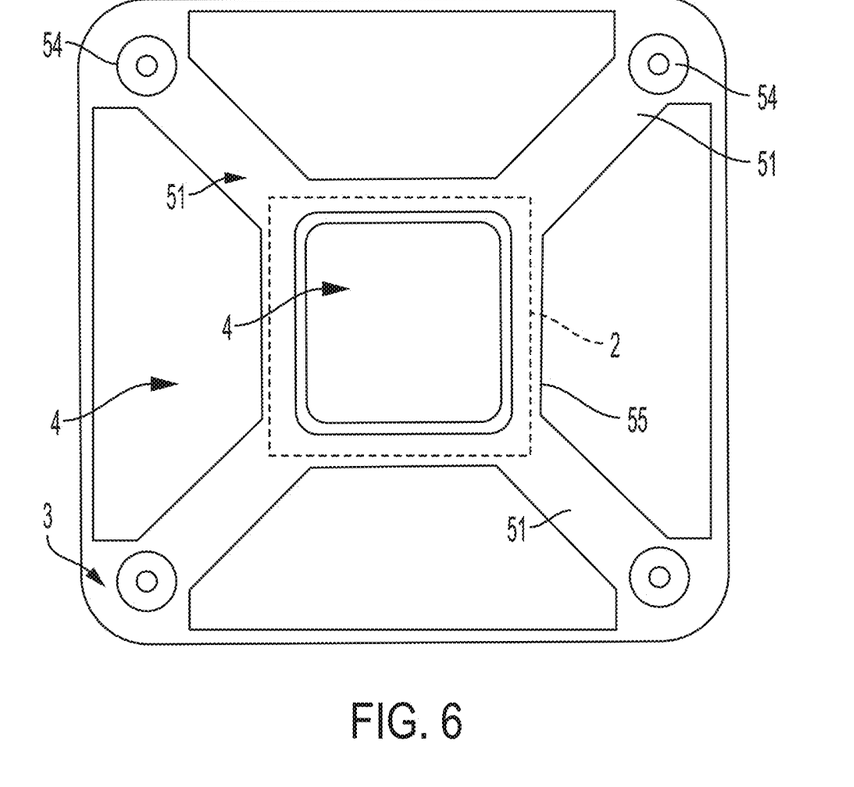
FIG. 6 shows a top view of the FIG. 5 heat transfer assembly.
Figure 7:
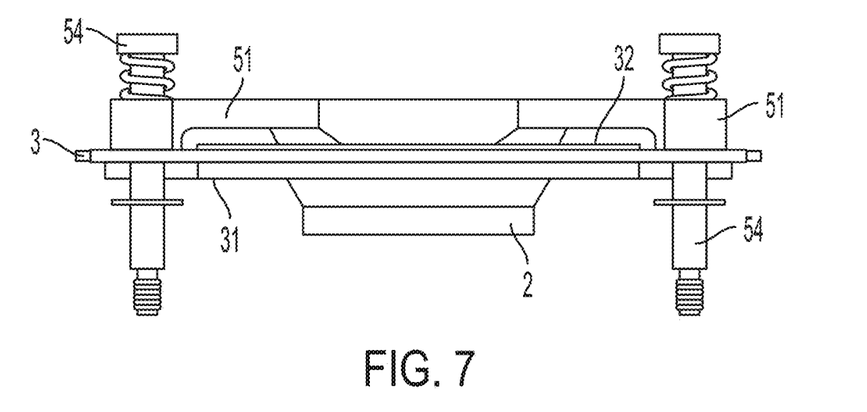
FIG. 7 is a side view of the FIG. 5 heat transfer assembly.

As noted above, the support 5 need not include a frame 53 from which one or more arms 51 extend. Instead, the support 5 can have one or more arms 51 that engage with a heat transfer device 3 without employing a frame 53. For example, FIGS. 5-7 show an embodiment in which arms 51 individually extend over a peripheral area toward a central area of a heat transfer device 3. In some embodiments, a first portion of the arms 51 is configured to engage with a fastener 54 to secure the support 5 and the heat transfer device 3 to a heat generating device 2. For example, the arms 51 can include an opening to receive a fastener 54, such as a bolt or screw, which can threadedly engage with a heat generating device 2, printed circuit board 1 or other structure to urge the support 5 and heat transfer device 3 into contact with the heat generating device 2. In some cases, the fasteners 54 can include a resilient element, such as a spring, to provide a bias on the support 5. Such a resilient element can help to maintain a suitable contact force between the heat transfer device 3 and the heat generating device 2 even while the fasteners 54, support 5, heat transfer device 3 or other components expand and/or contract due to temperature changes. In some cases, the heat transfer device 3 can include one or more openings through which the fasteners 54 can pass. For example, as can be seen in FIGS. 5-7, fasteners 54 can extend through openings in the peripheral area of the heat transfer device 3, e.g., to help suitably position the heat transfer device 3 relative to the heat generating device 2.

In some embodiments, two or more arms 51 can extend inwardly toward a central area of a heat transfer device 3 and join with each other over the central area. For example, as can be seen in FIGS. 5 and 6, portions of one or more arms 51 can join together over the central area of the heat transfer device 3 to define a window 55 with at least one opening that extends around and exposes a part of the central area of the heat transfer device 3. In some cases, a window 55 defined by one or more arms 51 can be positioned over a portion of the heat generating device 2. For example, FIG. 6 shows that the window 55 is positioned over an outer periphery of the contact area between the heat transfer device 3 and the heat generating device 2 (shown in dashed line in FIG. 6). A lower surface of the window 55 can contact the heat transfer device 3 in the central area and urge a lower portion of the heat transfer device 3 into contact with the heat generating device 2. Such a configuration can help ensure proper contact between the heat transfer device 3 and the heat generating device 2 while also exposing a portion of the second side of the heat transfer device 3 in the window 55 (e.g., bearing a boiling enhancement surface 4) for heat transfer to a cooling liquid. In some cases, parts of the heat transfer device 3 which are contacted by the one or more arms 51 whether at the peripheral area and/or the central area can have no boiling enhancement surface 4, or such parts may have a boiling enhancement surface 4 in whole or in part. The support 5 can be configured to avoid contact with a majority of the second side of the heat transfer device 3, e.g., a majority of a portion of the upper plate 32 that bears a boiling enhancement surface 4 and/or a majority of a central area of the upper plate 32. As can be seen in FIG. 7, portions of the arms 51 extend over and out of contact with the heat transfer device 3, e.g., there is a gap between the arms 51 and the heat transfer device 3 to permit cooling liquid to contact the heat transfer device 3. This configuration can provide mechanical support to the heat transfer device 3 while also maximizing a surface area of the heat transfer device 3 (particularly a side opposite that which contacts the heat generating device 2) for heat transfer to a cooling liquid.

In some embodiments, one or both sides of a heat transfer device 3 can be planar. For example, FIG. 3 shows an arrangement in which upper and lower sides of the heat transfer device 3 are both planar, whereas FIG. 7 shows an arrangement in which the upper side of the heat transfer device 3 is planar but the lower side is not. Instead, the lower plate 31 in FIG. 7 is configured to have a central portion which contacts the heat generating device 2 arranged in a plane that is offset (lower) than a plane of a portion of the plate 31 around the central portion. This configuration can help ensure that the heat transfer device 3 contacts a heat generating device 2 in a desired area of the heat transfer device 3. In addition, parts of the lower plate 31 which do not contact a heat generating device 2 can be available for heat transfer to a cooling liquid and can bear a boiling enhancement surface 4. Thus, parts of the lower plate 31 that are positioned around a central portion that contacts the heat generating device 2 can have a boiling enhancement surface 4. Although not shown, the upper plate 32 of surface of the heat transfer device 3 need not be planar, but instead could have a non-planar configuration. In some embodiments, a portion of the upper plate 32 which is contacted by cooling liquid (e.g., which bears a boiling enhancement surface 4 and/or is not contacted by a support 5) can be larger, e.g., 150% to 5000% larger, than a portion of the lower plate 31 which contacts the heat generating device 2.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

The use of "including," "comprising," "having," "containing," "involving," and/or variations thereof herein, is meant to encompass the items listed thereafter and equivalents thereof as well as additional items.

It should also be understood that, unless clearly indicated to the contrary, in any methods claimed herein that include more than one step or act, the order of the steps or acts of the method is not necessarily limited to the order in which the steps or acts of the method are recited.

While aspects of the invention have been described with reference to various illustrative embodiments, such aspects are not limited to the embodiments described. Thus, it is evident that many alternatives, modifications, and variations of the embodiments described will be apparent to those skilled in the art. Accordingly, embodiments as set forth herein are intended to be illustrative, not limiting. Various changes may be made without departing from the spirit of aspects of the invention.

The invention claimed is:

1. An immersion cooling system, comprising:
a heat transfer device having a first side and a second side, the first side having a first portion configured to contact and receive heat from a heat generating device and the second side having a second portion including a boiling enhancement coating configured to transfer heat received at the first portion to a cooling liquid, the heat transfer device including a peripheral area around a central area; and
a support configured to contact the second side within the central area of the heat transfer device to stiffen the heat transfer device and urge the first portion into contact with the heat generating device, the support including an arm that has a first arm portion that extends toward the central area over and out of contact with the heat transfer device and a second arm portion that contacts the heat transfer device within the central area.

2. The system of claim 1, wherein the heat transfer device is a spreader plate having the first and second sides.

3. The system of claim 1, wherein the heat transfer device is a vapor chamber having a first plate that defines the first side and a second plate joined to the first plate that defines the second side, the vapor chamber having a working fluid chamber between the first and second plates in which working fluid is contained.

4. The system of claim 1, wherein the first and second portions of the heat transfer device are on opposite sides of the heat transfer device.

5. The system of claim 1, wherein the heat transfer device includes at least one plate to define the first or second portion, and the first or second side is planar.

6. The system of claim 1, wherein the heat transfer device has insufficient strength to maintain suitable contact between the first portion of the heat transfer device and the heat generating device for heat transfer when engaged solely at the peripheral area.

7. The system of claim 1, further comprising fasteners configured to engage the support and secure the support and heat transfer device to the heat generating device, the fasteners each extending through a corresponding opening at the peripheral area of the heat transfer device.

8. The system of claim 1, wherein the second portion is 40 to 90% of a total area of the second side.

9. The system of claim 1, wherein the first arm portion extends inwardly over the peripheral area toward the central area.

10. The system of claim 1, wherein the support includes a plurality of arms and second arm portions of the plurality of arms define a window with at least one opening that extends around and exposes a part of the central area.

11. The system of claim 10, wherein a lower surface of the window contacts the heat transfer device at the central area to urge the first portion of the heat transfer device into contact with the heat generating device.

12. The system of claim 11, wherein each of the plurality of arms is configured to engage with a fastener to secure the heat transfer device to the heat generating device.

13. An immersion cooling system, comprising:
a heat transfer device having a first side and a second side, the first side having a first portion configured to contact and receive heat from a heat generating device and the second side having a second portion including a boiling enhancement coating configured to transfer heat received at the first portion to a cooling liquid, the heat transfer device including a peripheral area around a central area; and
a support configured to contact the second side within the central area of the heat transfer device to stiffen the heat transfer device and urge the first portion into contact with the heat generating device, the support including a frame positioned over the peripheral area and a plurality of arms that each extend radially inwardly from the frame and over a portion of the central area, each arm having a first arm portion that extends toward the central area over and out of contact with the heat transfer device and a second arm portion that contacts the heat transfer device within the central area.

14. The system of claim 13, wherein the plurality of arms forms an X shape over the central area.

15. The system of claim 13, wherein the second arm portion of each of the arms includes a post that extends downwardly to contact the second side.

16. The system of claim 10, wherein the support is configured to avoid contact with a majority of the second portion in the central area.

17. The system of claim 1, wherein the second portion of the heat transfer device has an area that is 150% to 5000% larger than the first portion of the heat transfer device.

18. The system of claim 1, wherein the second side is planar.

19. The system of claim 1, further comprising:
a tank configured to hold the cooling liquid; and
the heat generating device arranged in the tank and configured to generate heat;
wherein the first portion of the heat transfer device is held in contact with the heat generating device by the support.

20. The system of claim 1, wherein the boiling enhancement coating includes a sintered powder material that forms a porous structure.

21. The system of claim 1, wherein the boiling enhancement coating includes at least one layer of mesh to form a porous structure.

22. The system of claim 1, wherein the boiling enhancement coating includes a porous structure that is made by additive manufacturing means.

23. The system of claim 1, wherein the boiling enhancement coating includes a porous structure that is made by subtractive manufacturing means.

24. The system of claim 1, wherein the support is configured to contact the heat transfer device to cause the heat transfer device to bow downwardly at the central area relative to the peripheral area.

* * * * *